United States Patent
Shih (10) Patent No.: US 9,653,546 B2
(45) Date of Patent: May 16, 2017

(54) NANOWIRE STRUCTURE AND MANUFACTURING METHOD THEREOF

(71) Applicant: UNITED MICROELECTRONICS CORP., Hsin-Chu (TW)

(72) Inventor: Hsueh-Hao Shih, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/689,042

(22) Filed: Apr. 16, 2015

(65) Prior Publication Data

US 2016/0268376 A1    Sep. 15, 2016

(30) Foreign Application Priority Data

Mar. 12, 2015   (CN) .......................... 2015 1 0107611

(51) Int. Cl.
| H01L 21/336 | (2006.01) |
|---|---|
| H01L 29/06 | (2006.01) |
| H01L 29/66 | (2006.01) |
| H01L 21/762 | (2006.01) |
| H01L 29/423 | (2006.01) |
| H01L 29/78 | (2006.01) |

(52) U.S. Cl.
CPC .... *H01L 29/0673* (2013.01); *H01L 21/76224* (2013.01); *H01L 29/42392* (2013.01); *H01L 29/66795* (2013.01); *H01L 29/785* (2013.01)

(58) Field of Classification Search
CPC ........... H01L 29/0673; H01L 21/02236; H01L 21/02532; H01L 21/02603; H01L 21/76224; H01L 29/0653; H01L 29/42392; H01L 29/66795; H01L 29/785

USPC ........................................................ 438/283
See application file for complete search history.

(56) References Cited

U.S. PATENT DOCUMENTS

| 7,663,166 | B2 * | 2/2010 | Kim ................... H01L 29/0657 257/288 |
|---|---|---|---|
| 8,399,330 | B2 | 3/2013 | Liu |
| 8,420,455 | B2 * | 4/2013 | Bangsaruntip ......... B82Y 10/00 257/E21.404 |
| 8,445,973 | B2 * | 5/2013 | Luo .................. H01L 29/66795 257/401 |
| 8,546,863 | B2 * | 10/2013 | Huerta .................. B82Y 10/00 257/302 |
| 8,853,019 | B1 | 10/2014 | Fronheiser |
| 2014/0353574 | A1 * | 12/2014 | Li ...................... H01L 29/0673 257/9 |

* cited by examiner

*Primary Examiner* — Xinning Niu
*Assistant Examiner* — Vu A Vu
(74) *Attorney, Agent, or Firm* — Winston Hsu; Scott Margo

(57) ABSTRACT

A manufacturing method of a nanowire structure includes the following steps. A fin and a shallow trench isolation (STI) are formed on a substrate. A first patterned insulation layer is formed on an exposed upper part of the fin. The STI is then recessed for exposing a lower part of the fin. A second patterned insulation layer is formed in second regions for covering the first patterned insulation layer and the exposed part of the fin. The lower part of the fin is then removed for forming an upper fin and a lower fin in a first region. The STI is further recessed for exposing a portion of the lower fin and a portion of the fin in the second regions. The first patterned insulation layer on the first region is removed, and the upper fin is converted into a first nanowire.

12 Claims, 13 Drawing Sheets

NANOWIRE STRUCTURE AND MANUFACTURING METHOD THEREOF

BACKGROUND OF THE INVENTION

1. Field of the Invention

The present invention relates to a manufacturing method of a nanowire structure, and more particularly, to a manufacturing method converting a part of a fin into a nanowire in a nanowire structure.

2. Description of the Prior Art

The conventional planar metal-oxide-semiconductor (hereinafter abbreviated as MOS) transistor has difficulty when scaling down to 65 nm and below. Therefore, the non-planar transistor technology such as Fin Field effect transistor (hereinafter abbreviated as FinFET) technology that allows smaller size and higher performance is developed to replace the planar MOS transistor. For example, dual-gate FinFET device, tri-gate FinFET device, and omega-FinFET device have been provided. Furthermore, gate-all-around (GAA) nanowire FET device is progressed for achieving the ongoing goals of High performance, low cost, increased miniaturization of integrated circuit components, and greater packaging density of integrated circuits. In addition, nanowires containing germanium (Ge) are used to further enhance the mobility of the nanowire transistor in the related industries for devices such as logic units and memory units with higher specifications

SUMMARY OF THE INVENTION

It is one of the objectives of the present invention to provide a nanowire structure and a manufacturing method thereof. A part of a fin is converted into a nanowire by approaches such as forming patterned insulation layers and recessing a shallow trench isolation.

A manufacturing method of a nanowire structure is provided in an embodiment of the present invention. The manufacturing method includes following steps. A fin and a shallow trench isolation (STI) are formed on a substrate. The STI surrounds the fin. An upper part of the fin is exposed from the STI. The fin includes a first region and two second regions, and the first region is disposed between the two second regions. A first patterned insulation layer is then formed on the exposed upper part of the fin. The STI is recessed by a recessing process for exposing a lower part of the fin. A second patterned insulation layer is then formed on the second regions of the fin. The second patterned insulation layer covers the first patterned insulation layer and the exposed part of the fin in the second region. The exposed lower part of the fin is then removed for forming an upper fin and a lower fin in the first region. A gap is formed between the upper fin and the lower fin in a vertical projective direction. The STI is then further recessed by another recessing process for exposing a portion of the lower fin and a portion of the fin in the second regions. Subsequently, the first patterned insulation layer on the first region is removed, and the upper fin is converted into a first nanowire.

A nanowire structure is provided in another embodiment of the present invention. The nanowire structure includes a first nanowire and a second nanowire. The first nanowire is disposed on a substrate. The second nanowire is disposed between the first nanowire and the substrate in a vertical projective direction. The first nanowire is parallel to the second nanowire, and a width of the first nanowire is different from a width of the second nanowire.

A nanowire structure is provided in further another embodiment of the present invention. The nanowire structure includes a nanowire and a fin structure. The nanowire is disposed on a substrate. The fin structure is disposed between the nanowire and the substrate in a vertical projective direction. The nanowire is parallel to the fin structure.

According to the manufacturing method of the nanowire structure in the present invention, a plurality of nanowire or a nanowire and a fin structure may be formed and aligned in the vertical projective direction in the nanowire structure. The purposes of enhancing the integrity and the efficiency of the related units may be achieved accordingly.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-20 are schematic drawings illustrating a manufacturing method of a nanowire structure according to a first embodiment of the present invention, wherein

FIGS. 21-25 are schematic drawings illustrating a manufacturing method of a nanowire structure according to a second embodiment of the present invention, wherein

DETAILED DESCRIPTION

Figure 1:
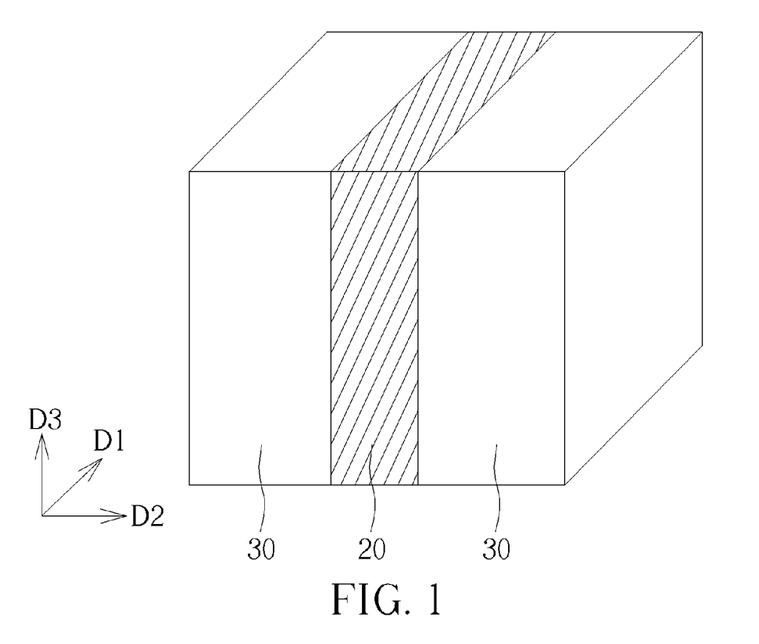
FIG. 1 is a schematic drawing illustrating a corresponding region in FIG. 2.
Figure 2:
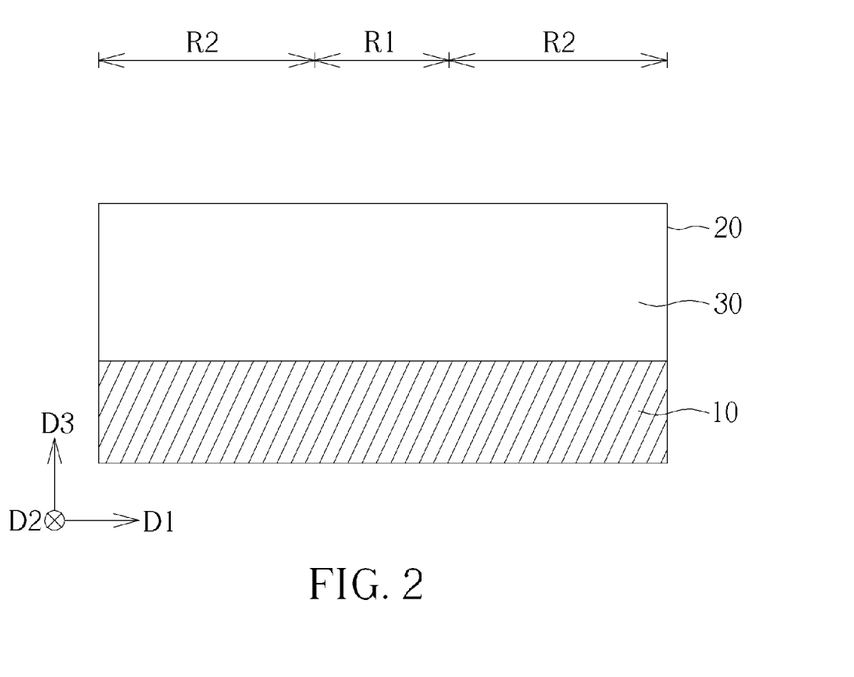

Please refer to FIGS. 1-20. FIGS. 1-20 are schematic drawings illustrating a manufacturing method of a nanowire structure according to a first embodiment of the present invention. FIG. 1, FIG. 3, FIG. 4, FIG. 5, FIG. 8, FIG. 10, FIG. 13, FIG. 15, and FIG. 18 are stereoscopic schematic drawings. FIG. 7 is a cross-sectional drawing taken along a line A-A' in FIG. 6. FIG. 12 is a cross-sectional drawing taken along a line B-B' in FIG. 11. FIG. 17 is a cross-sectional drawing taken along a line C-C' in FIG. 16. FIG. 1, FIG. 5, FIG. 8, FIG. 10, FIG. 13, FIG. 15, and FIG. 18 are schematic drawings illustrating corresponding regions in FIG. 2, FIG. 6, FIG. 9, FIG. 11, FIG. 14, FIG. 16, and FIG. 19 respectively. For example, FIG. 1 may be regarded as a stereoscopic schematic drawing illustrating a left hag or a right half of FIG. 2 without a substrate, and relations between the other stereoscopic schematic drawings and the corresponding drawings are similar to this. A manufacturing method of a nanowire structure is provided in this embodiment. The manufacturing method includes the following steps. A plurality of fins and shallow trench isolations are formed on a semiconductor substrate. For describing conveniently, as shown in FIG. 1 and FIG. 2, at least one fin 20 and a shallow trench isolation (STI) 30 are formed on a substrate 10. The fin 20 extends in a first direction D1, and the fin 20 includes a first region R1 and two second regions R2. The first region R1 is disposed between the two second regions R2 in the first direction D1. In addition, the first region R1 and the two second regions R2 may also be defined on the substrate 10, two ends of the fin 20 in the first direction D1 are disposed in the second regions R2 respectively, and a section of the fin 20 between the two ends of the fin 20 is disposed in the first region R1. The STI 30 surrounds the fin 20, and the STI 30 is disposed on two sides of the fin 20 in a second direction D2 perpendicular to the first direction D1. The first region D1 may be regarded as a region corresponding to a gate electrode formed subsequently, and the second regions R2 may be regarded as source/drain regions formed subsequently, but not limited thereto.

The substrate 10 in this embodiment may include a silicon substrate, an epitaxial silicon substrate, a silicon germanium substrate, a silicon carbide substrate, or a silicon-on-insulator (SOI) substrate, but not limited thereto. The fin 20 is a silicon fin preferably and may be formed by photolithography processes such as a sidewall image transfer (SIT) process on the substrate 10, but not limited thereto. Materials of the STI 30 may include silicon oxide or other appropriate insulation materials. The STI 30 may be formed by forming an insulation material covering the fin 20 after the fin is formed and then removing the excess insulation material by a process such as a chemical mechanical polishing (CMP) process so as to make a height of the STI 30 substantially equal to a height of the fin 20 in a vertical projective direction D3, but not limited thereto.

Figure 3:
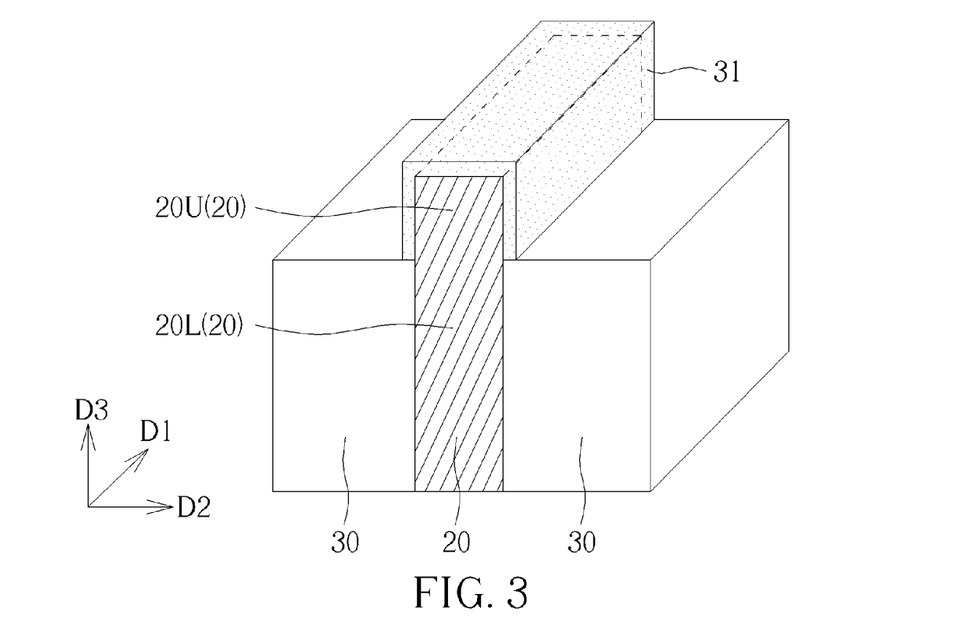
FIG. 3 is a schematic drawing in a step subsequent to FIG. 1.

As shown in FIG. 3, a recessing process may be performed to recess the STI 30 and lower the height of the STI 30 in the vertical projective direction D3. An upper part 20U of the fin 20 is exposed from the STI 30 accordingly.

Subsequently, a first patterned insulation layer 31 is formed on the exposed upper part 20U of the fin 20 by processes such as a deposition process, a photolithography process, and etching process. The first patterned insulation layer may include silicon nitride, silicon oxynitride, or other appropriate insulation materials. The first patterned insulation layer 31 is formed on the first region R1 and the second regions R2 of the fin 20. Additionally, in other embodiments of the present invention, the first patterned insulation layer 31 may also be formed and self-aligned by performing a nitridation or a oxidation process to the exposed part of the fin 20, or a hard mask layer (not shown) formed on the fin 20 and sidewall spacers (not shown) formed on the two sides of the fin 20 may be used as the first patterned insulation layer 31 mentioned above.

Figure 4:
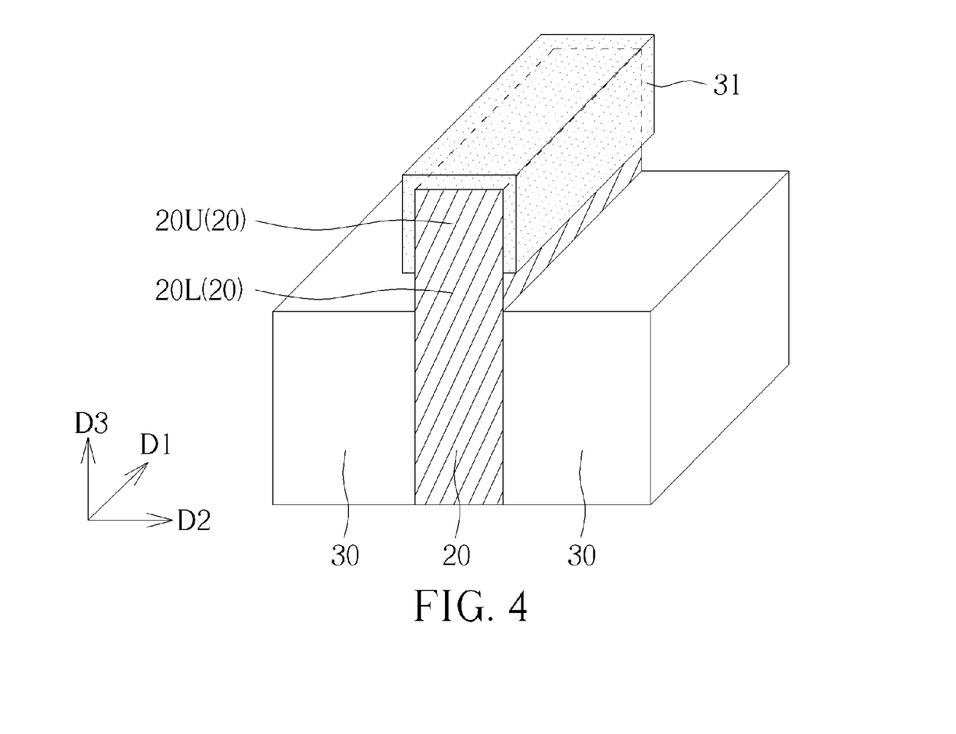
FIG. 4 is a schematic drawing in a step subsequent to FIG. 3.

As shown in FIG. 4, the STI 30 is further recessed by a recessing process for exposing a lower part 20L of the fin 20. The upper part 20U of the fin 20 is connected with the lower part 20L of the fin 20. The upper part 20U of the fin 20 is covered by the first patterned insulation layer 31, and at least a part of the lower part 20L of the fin 20 is not covered by the first patterned insulation layer 31 and the STI 30.

Figure 5:
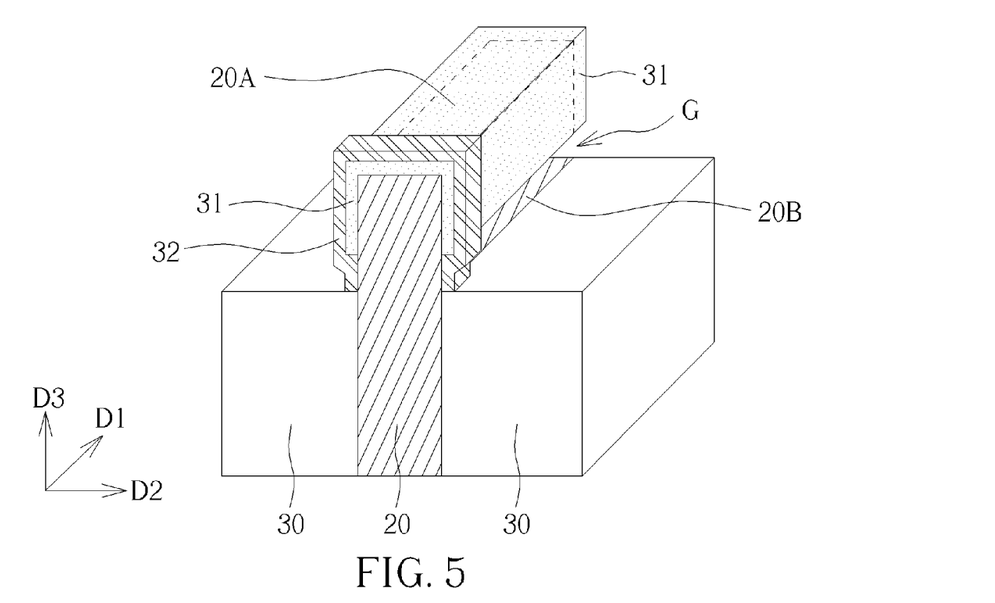
FIG. 5 is a schematic drawing illustrating a corresponding region in FIG. 6.
Figure 6:
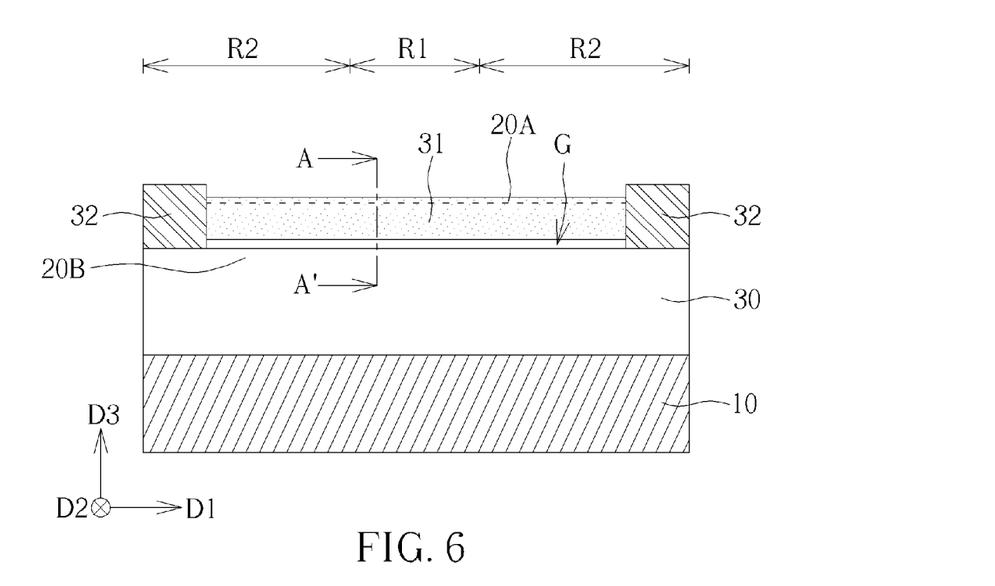
FIG. 6 is a schematic drawing in a step subsequent to FIG. 4.
Figure 7:
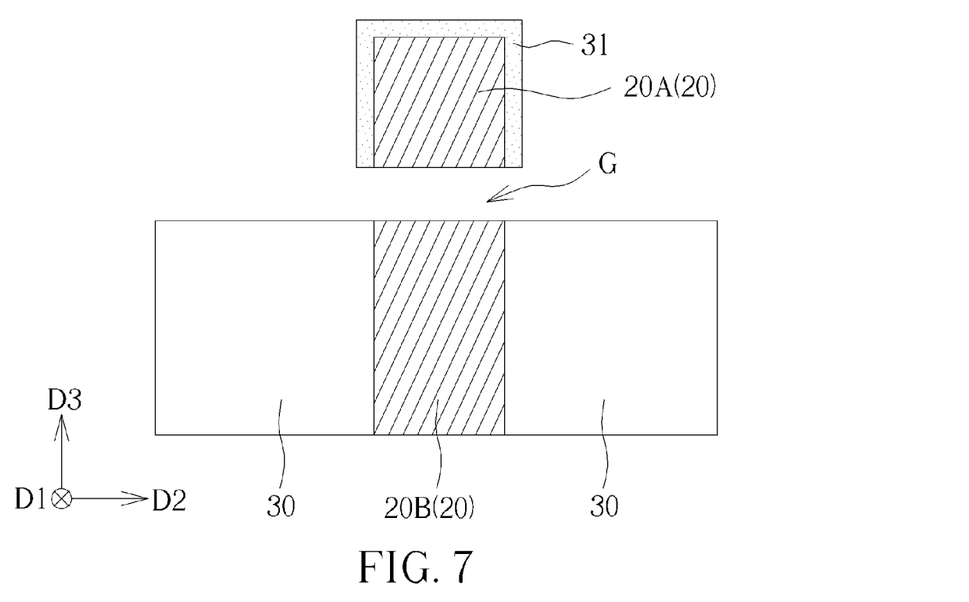
FIG. 7 is a cross-sectional drawing taken along a line A-A' in FIG. 6.

As shown in FIGS. 5-7, two second patterned insulation layers 32 are then formed on the second regions R2 at the two ends of the fin 20 respectively by processes such as a deposition process, a photolithography process, and etching process. Therefore, on the second regions R2, the two second patterned insulation layers 32 may cover the first patterned insulation layer 31 and the fin 20 exposed from the first insulation layer 31 and the STI. After the step of forming the second patterned insulation layers 32, the exposed lower part 20L of the fin 20 is then removed for forming an upper fin 20A and a lower fin 20B in the first region R1. The method for removing the exposed part of the fin 20 may include a wet etching process, but not limited thereto. In other words, the first patterned insulation layer 31 may be used as a shielding mask for the upper fin 20A, and the second patterned insulation layers 32 may be used as a shielding mask keeping the fin 20 in the second regions R2 from being etched. The fin 20 in the second regions R2 may be kept for forming supporting pillar structures, but not limited thereto.

A gap G is formed between the upper fin 20A and the lower fin 20B in the vertical projective direction D3. In other words, the upper fin 20A is suspended above the lower fin 20B in the first region R1. The upper fin 20A is separated from the lower fin 20B in the first region R1m and the upper fin 20A and the lower fin 20B are still connected to each other in the second regions R2 via unetched parts of the fin 20. The second patterned insulation layers 32 may include silicon nitride, silicon oxynitride, or other appropriate insulation materials. The upper fin 20A and the lower fin 20B may extend to the second regions R2 by controlling the coverage of the second patterned insulation layers in the second regions R2, but not limited thereto.

Figure 8:
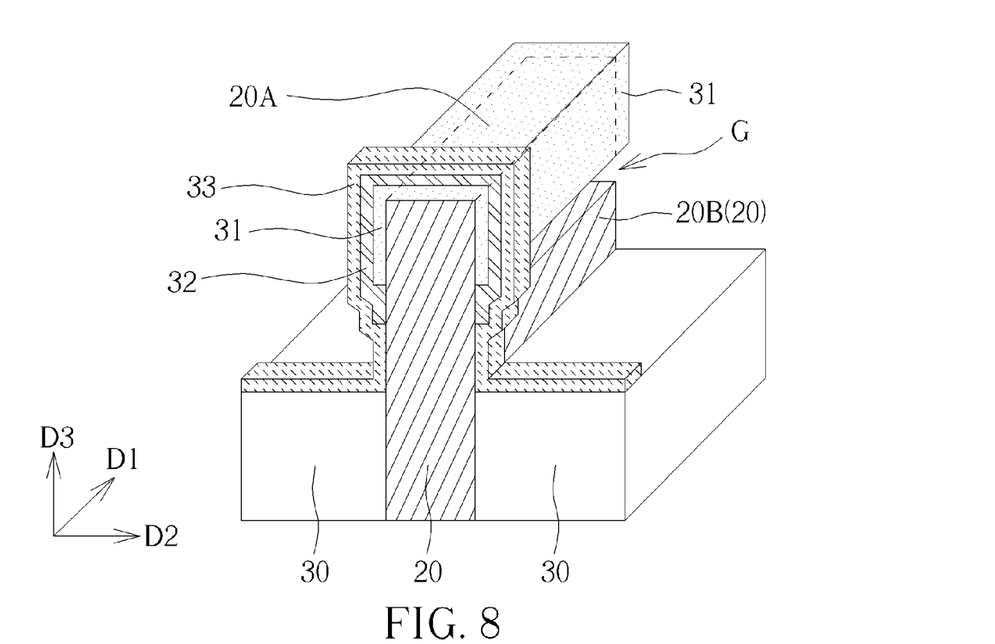
FIG. 8 is a schematic drawing illustrating a corresponding region in FIG. 9.
Figure 9:
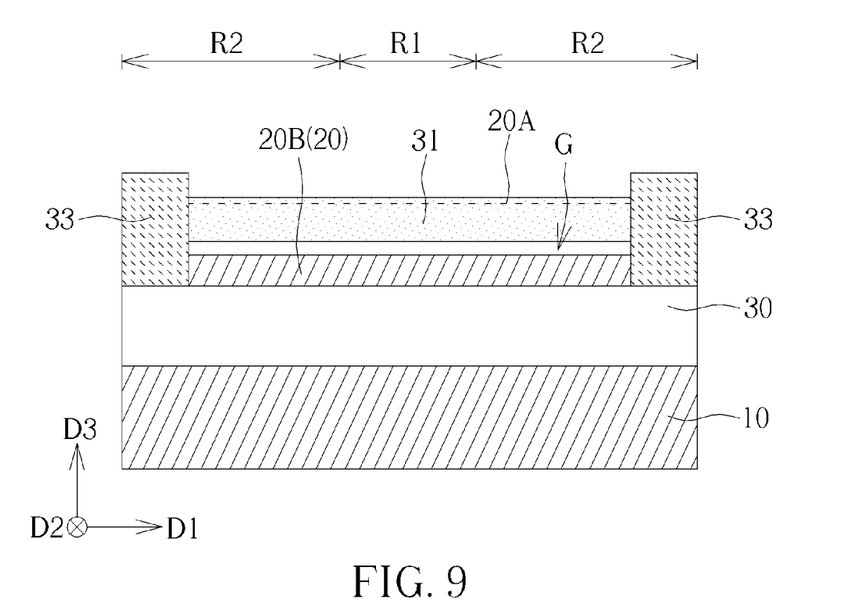
FIG. 9 is a schematic drawing in a step subsequent to FIG. 6.

As shown in FIG. 8 and FIG. 9, after the step of forming the upper fin 20A and the lower fin 20B, the STI 30 may be further recessed by another recessing process for further lowering the height of the STI 30 in the vertical projective direction D3 and exposing a portion of the lower fin 20B and a portion of the fin 20 in the second regions R2. Two sides of the lower fin 20B in the second direction D2 are at least partially uncovered by the STI 30. Subsequently, third patterned insulation layers 33 are formed on the second regions R2 respectively by processes such as a deposition process, a photolithography process, and etching process. The third patterned insulation layer 33 covers the second patterned insulation layer 32 and the exposed part of the fin 20 in the second regions R2. The third patterned insulation layers 33 may include silicon nitride, silicon oxynitride, or other appropriate insulation materials.

Figure 10:
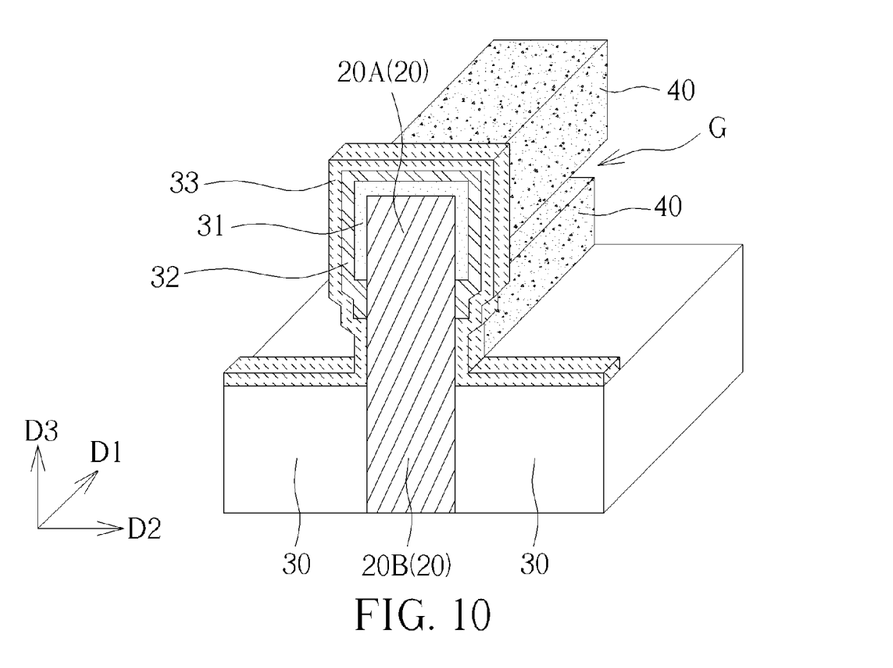
FIG. 10 is a schematic drawing illustrating a corresponding region in FIG. 11.
Figure 11:
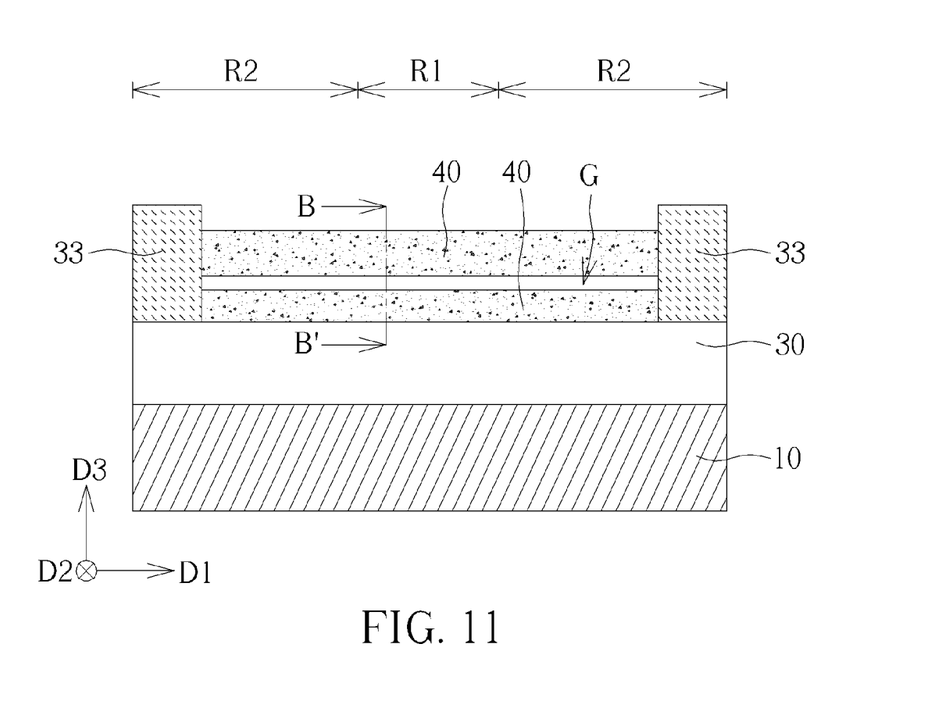
FIG. 11 is a schematic drawing in a step subsequent to FIG. 9.
Figure 12:
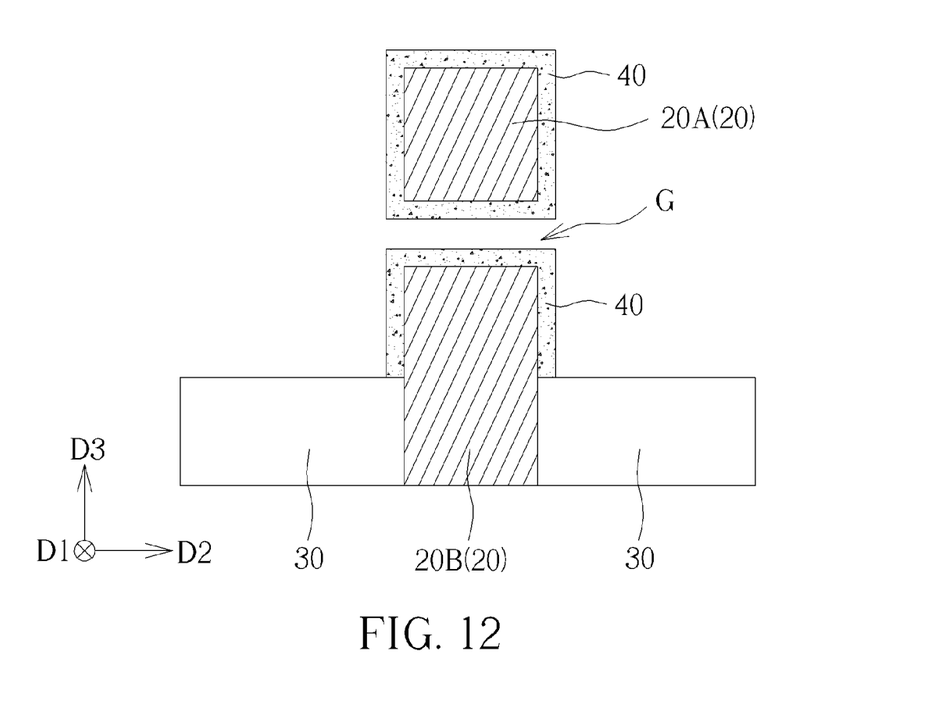
FIG. 12 is a cross-sectional drawing taken along a line B-B' in FIG. 11.

As shown in FIGS. 10-12, the first patterned insulation layer 31 on the first region R1 or the first patterned insulation layer 31 uncovered by the second patterned insulation layer 32 or/and the third patterned insulation layer 33 is removed so as to expose the upper fin 20A. An epitaxial layer 40 is then formed on the upper fin 20A and the lower fin 20B respectively. IN this embodiment, a material of the epitaxial layer 40 and a material of the fin 20 may be the same or different, and the material of the epitaxial layer 40 may be selected from appropriate materials according to electrical property requirements of the transistors to be manufactured. For example, the epitaxial layer 40 may include a germanium epitaxial layer or a silicon-germanium epitaxial layer, but not limited thereto. The epitaxial layer 40 may be formed on surfaces of the exposed upper fin 20A and the exposed lower fin 20B by epitaxial growth, and the epitaxial layer 40 will not be formed on the regions of the fin 20 covered by the first patterned insulation layer 31, the second patterned insulation layer 32, and the third patterned insulation layer 33. The epitaxial layer 40 may be formed on two sides of the upper fin 20A in the second direction D2, and an upper surface and a lower surface of the upper fin 20A in the vertical projective direction D3. The epitaxial layer 40 may be formed only on two sides of the lower fin 20B in the second direction D2 and an upper surface of the lower fin 20B because a part of the lower fin 20B is still covered and surrounded by the STI 30.

Figure 13:
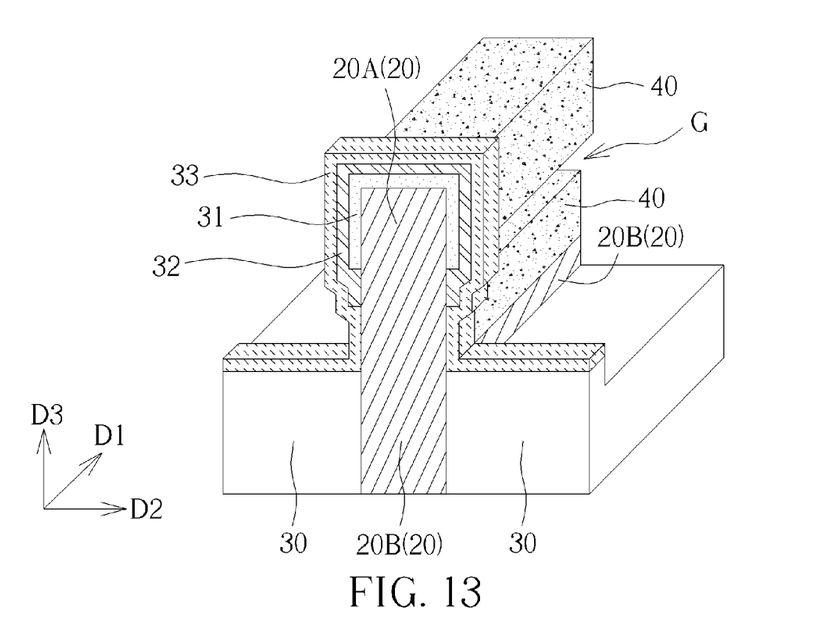
FIG. 13 is a schematic drawing illustrating a corresponding region in FIG. 14.
Figure 14:
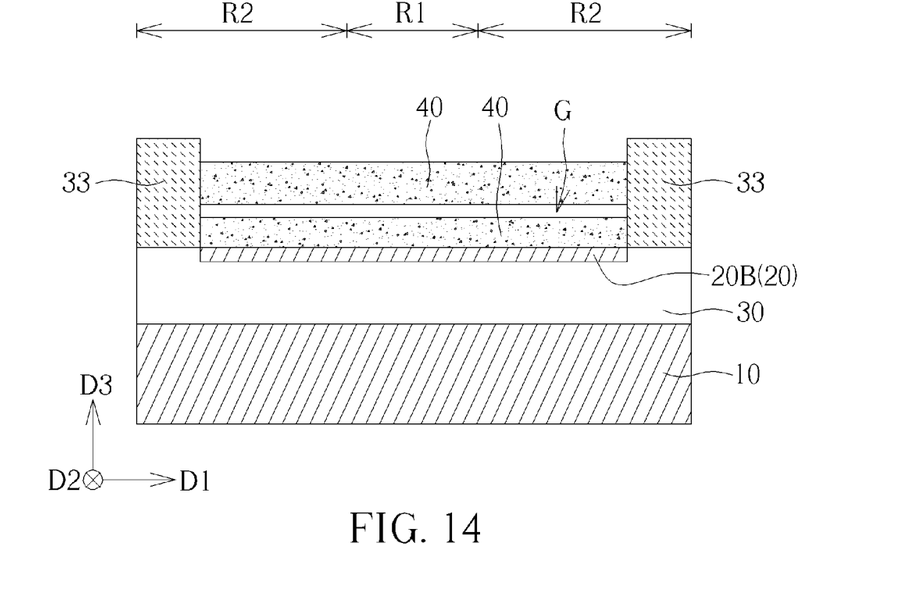
FIG. 14 is a schematic drawing in a step subsequent to FIG. 11.

As shown in FIG. 13 and FIG. 14, after the step of forming the epitaxial layer 40, the STI 30 may selectively be further recessed by another recessing process for lowering the height of the STI 30 in the vertical projective direction D3 again and exposing at least a part of the lower fin 20B uncovered by the epitaxial layer 40. In this embodiment, the third patterned insulation layer 33 extends from two sides of the fin 20 in the second direction D2 and covers the surface of the STI 30 so as to protect a part of the fin 20 in the second regions R2 from being exposed by subsequent recessing processes of the STI 30, but not limited thereto.

Figure 15:
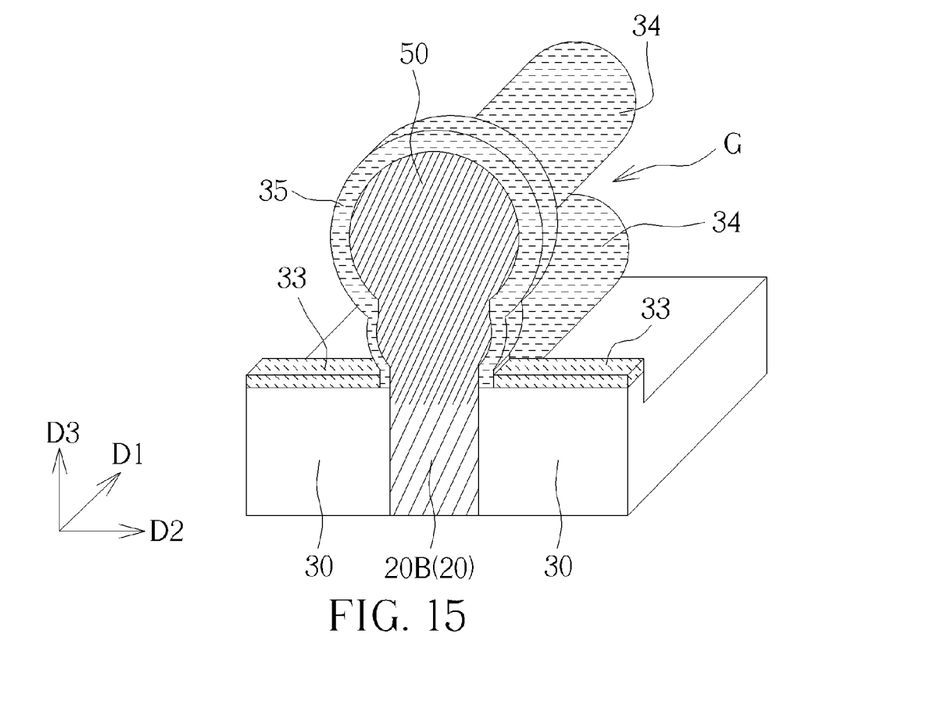
FIG. 15 is a schematic drawing illustrating a corresponding region in FIG. 16.
Figure 16:
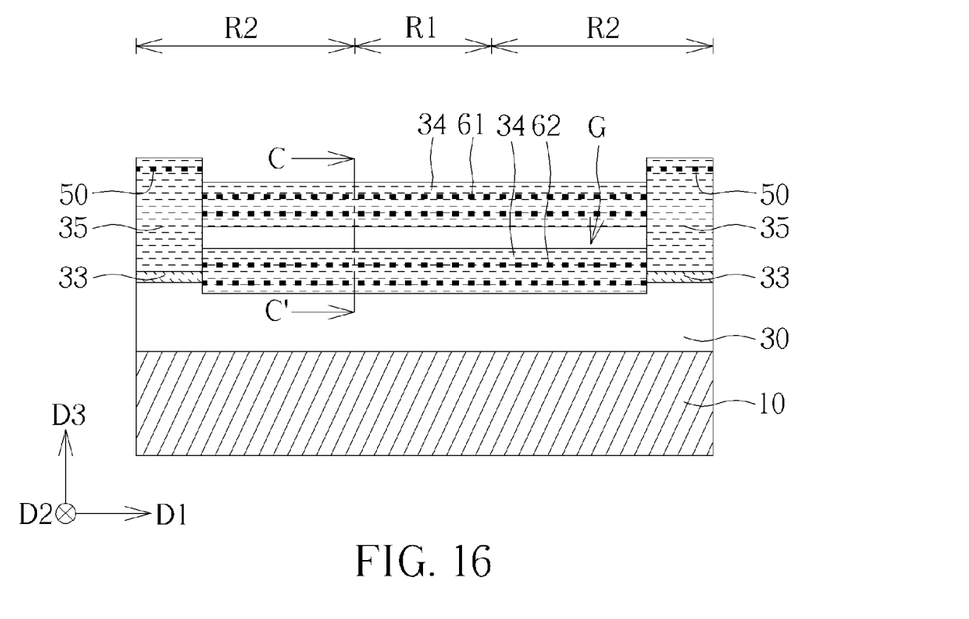
FIG. 16 is a schematic drawing in a step subsequent to FIG. 14.
Figure 17:
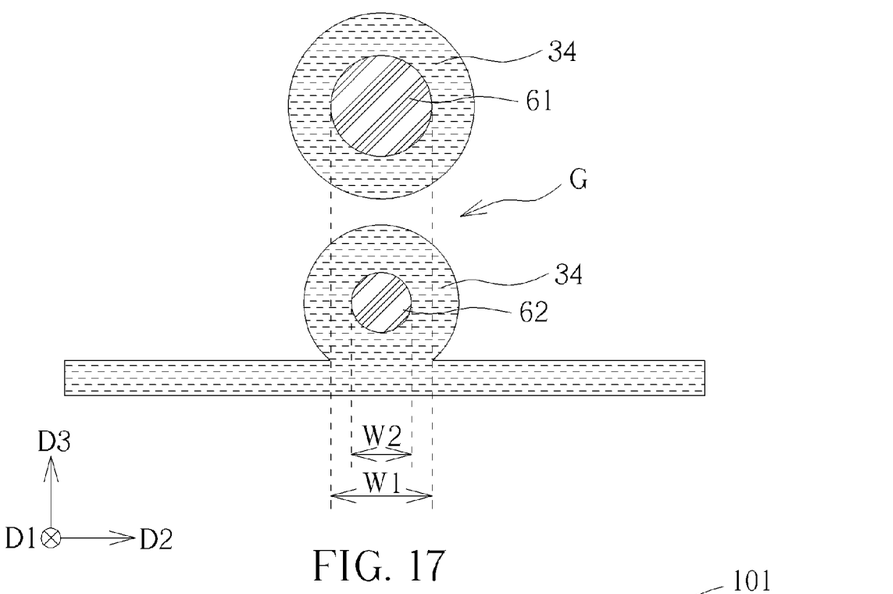
FIG. 17 is a cross-sectional drawing taken along a line C-C' in FIG. 16.

As shown in FIGS. 15-17, an oxidation process is then performed. The oxidation process is configured to convert the upper fin covered by the epitaxial layer into a first nanowire 61 surrounded by a first oxide layer 34, convert the lower fin covered by the epitaxial layer into a second nanowire 62 surrounded by the first oxide layer 34, and covert the fin 20 covered by the first patterned insulation layer, the second patterned insulation layer, and the third patterned insulation layer in the second regions R2 into two pillar structures 50 covered by a second oxide layer 35 in the two second regions R2 respectively. In other words, the second nanowire 62 is formed between the first nanowire 61 and the substrate 10 in the vertical projective direction D3, and the recessing process of the STI 30 as shown in FIG. 13 and FIG. 14 is performed after the step of forming the epitaxial layer and before the oxidation process. In the oxidation process of this embodiment, silicon elements in the upper fin, the lower fin, or/and the epitaxial layer may be oxidized more easily and diffuse outward relatively, and germanium elements in the epitaxial layer will diffuse inward and gather to form a germanium nanowire. The first oxide layer 34 covering the germanium nanowire may be a silicon oxide layer. Therefore, the first nanowire 61 and the second nanowire 62 may be a germanium nanowire respectively, but not limited thereto. In other embodiments of the present invention, nanowires made of other components may also be formed by forming epitaxial layer with other materials according to the design considerations.

It is worth noting that in the second direction D2, a width of the second nanowire 62 will be less than a width of the first nanowire 61 because four sides of the upper fin are covered by the epitaxial layer and only three sides of the lower fin are covered by the epitaxial layer before the oxidation process. For example, the first nanowire 61 has a first width W1 in the second direction D2, the second nanowire 62 has a second width W2 in the second direction D2, and the second width W2 is less than the first width W1, but not limited thereto. In other embodiments of the present invention, the second nanowire 62 may be formed with a width larger than that of the first nanowire 61 by a cone-shaped fin 20 with a thin top and a wide bottom or by other manufacturing approaches. Additionally, the first nanowire 61 and the second nanowire 62 are separated from each other in the first region R1, and the first nanowire 61 and the second nanowire 62 are connected to the pillar structures 50 in the second regions R2. The main material of the pillar structure 50 is silicon still because the pillar structures 50 are not formed by the epitaxial layer in the oxidation process. There is a gradually increasing distribution condition of the concentration of germanium from the pillar structure 50 to the first nanowire 61 and the second nanowire 62, but not limited thereto.

Figure 18:
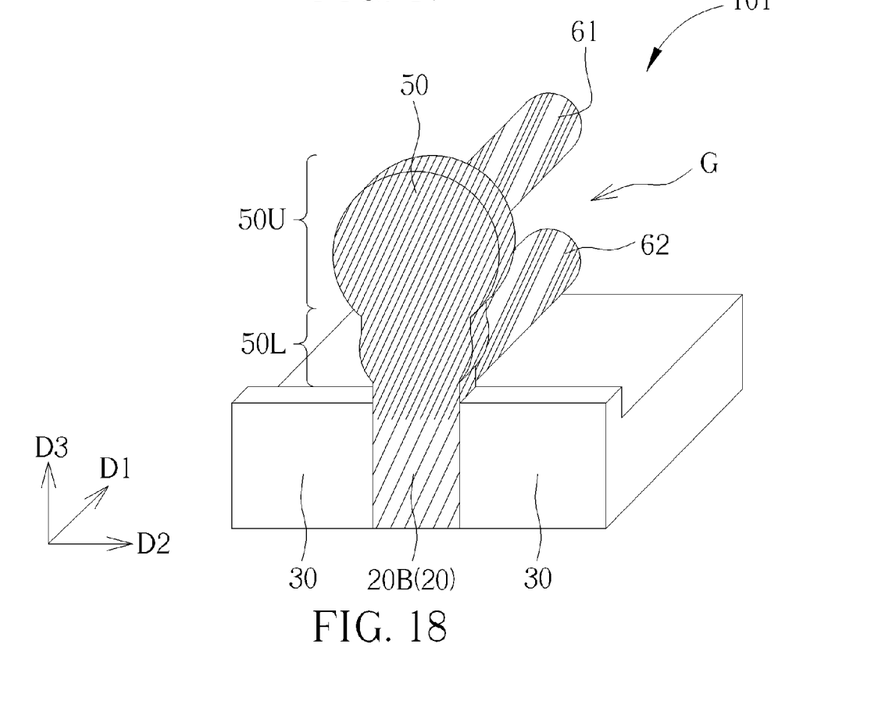
FIG. 18 is a schematic drawing illustrating a corresponding region in FIG. 19.
Figure 19:
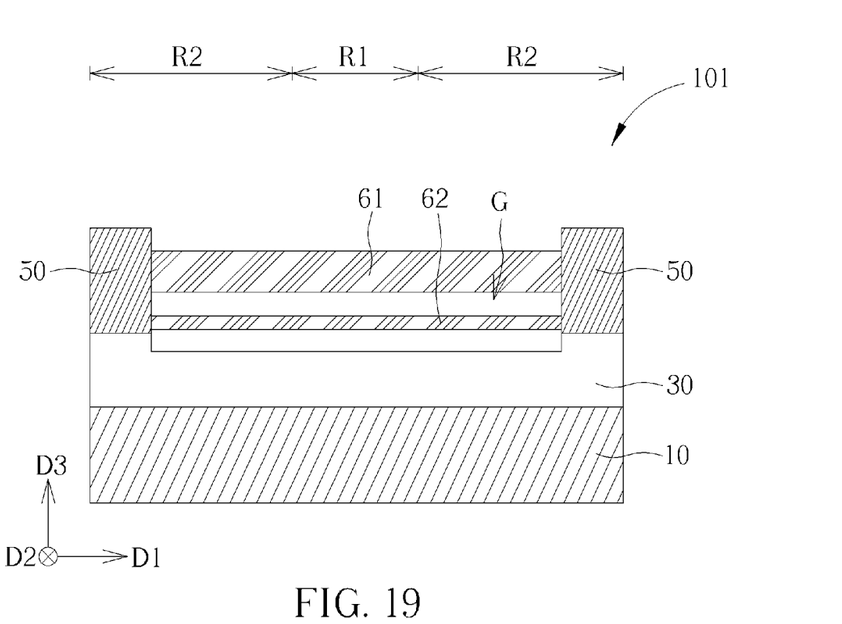
FIG. 19 is a schematic drawing in a step subsequent to FIG. 16.

As shown in FIG. 18 and FIG. 19, the first oxide layer and the second oxide layer formed in the oxidation process mentioned above are removed for forming a nanowire structure 101. As shown in FIG. 18, FIG. 19, and FIG. 17, the nanowire structure 101 in this embodiment includes the first nanowire 61 and the second nanowire 62. The first nanowire 61 is disposed on the substrate 10. The first nanowire 61 extends in the first direction D1. The substrate 10 has a first region R1 and two second regions R2, and the first region R1 is disposed between the two second regions R2 in the first direction D1. The second nanowire 62 is disposed between the first nanowire 61 and the substrate 10 in the vertical projective direction D3. The second nanowire 62 extends in the first direction D1. The first nanowire 61 is parallel to the second nanowire 62, and the width of the first nanowire 61 is different from the width of the second nanowire 62. In this embodiment, the width of the second nanowire 62 may be less than the width of the first nanowire 61 for example, but the present invention is not limited to this. For instance, the first width W1 of the first nanowire 61 in the second direction D2 ranges between 10 nanometers and 30 nanometers preferably, and the second width W2 of the second nanowire 62 in the second direction D2 ranges between 7 nanometers and 27 nanometers preferably, but not limited thereto. Additionally, the nanowire structure 101 may further include two pillar structures 50 disposed in the two second regions R2 respectively. The first nanowire 61 and the second nanowire 62 are separated from each other in the first region R1 by the gap G, and the first nanowire 61 and the second nanowire 62 are connected to the pillar structures 50 in the second regions R2. In other words, the first nanowire 61 and the second nanowire 62 aligned in the vertical projective direction D3 are separated from each other in the first region R1 and connected with each other in the second regions R2 via the pillar structures 50. The pillar structures 50 may be used to support the first nanowire 61 and the second nanowire 62 suspended above the substrate 10. A width of an upper part 50U of the pillar structure 50 in the second direction D2 will be larger than a width of a lower part 50L of the pillar structure 50 in the second direction D2 preferably because the pillar structure 50 is formed from the fin 20 covered by multiple patterned insulation layers stacked with one another in the oxidation process, but nor limited thereto. It is worth noting that the manufacturing method in the present invention is not limited to the first nanowire 61 and the second nanowire 62 mentioned above. In other embodiments of the present invention, three or more than three nanowires aligned in the vertical projective direction D3 may be formed by the same manufacturing approaches.

Figure 20:
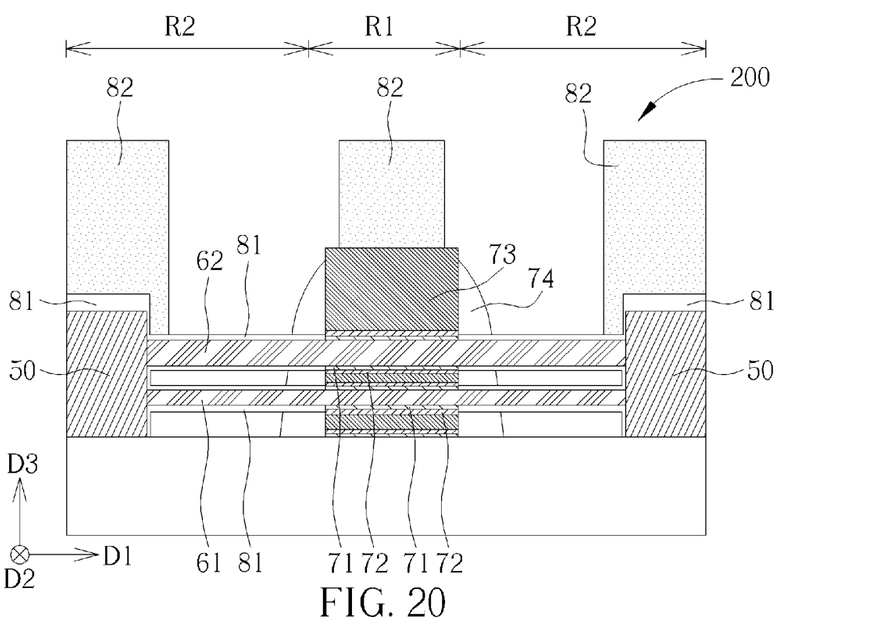
FIG. 20 is a schematic drawing in a step subsequent to FIG. 19.

As shown in FIG. 20, the manufacturing method of the nanowire structure in this embodiment may further include forming a gate insulation layer 71 and a gate electrode 73. The gate electrode 73 surrounds the first nanowire 61 and the second nanowire 62 in the first region R1, and the gate insulation layer 71 is formed between the gate electrode 73 and the first nanowire 61 and between the gate electrode 73 and the second nanowire 62. The gate insulation layer 71 may include a high dielectric constant (high k) gate insulation layer, but not limited thereto. Additionally, the manufacturing method in this embodiment may selectively include forming a sidewall spacer 74, a metal silicide layer 81, and a plurality of conductive plugs 82 so as to form a nanowire transistor 200 shown in FIG. 20. In other words, the nanowire structure in this embodiment may be applied for forming the nanowire transistor, but the present invention is not limited to this. The nanowire of the present invention may also be applied in other semiconductor devices according to other considerations. In the nanowire transistor 200, a work function layer 72 surrounded the first nanowire 61 and the second nanowire 62 may be further included if the gate electrode 73 is a metal gate electrode, and the work function layer 72 is disposed between the gate electrode 73 and the gate insulation layer 71. The sidewall spacer 74 is disposed on two sides of the gate electrode 73 in the first direction D1, and the sidewall spacer 74 covers a part of the first nanowire 61 and a part of the second nanowire 62. The metal silicide layer 81 is formed on a part of the first nanowire 61 uncovered by the gate electrode 73 and the sidewall spacer 74 and a part of the second nanowire 62 uncovered by the gate electrode 73 and the sidewall spacer 74. The metal silicide layer 81 may also formed on the pillar structures 50. Source/drain regions may be formed by an ion doping process on the pillar structures 50 and regions of the first nanowire 61 and the second nanowire 62 uncovered by the gate electrode 73 and the sidewall spacer 74. The conductive plugs 82 are electrically connected to the metal silicide layer 81 on the source/drain region or the gate electrode 73 respectively. According to the manufacturing method in this embodiment, a plurality of nanowires corresponding to one another in the vertical projective direction D3 may be formed for enhancing the device integrity and improving the efficiency of the nanowire transistor correspondingly formed. In addition, the nanowire transistor based on the nanowire structure of the present invention is not limited to the structure shown in FIG. 20, and the nanowire structure of the present invention may also be applied to other transistor structures.

Figure 21:
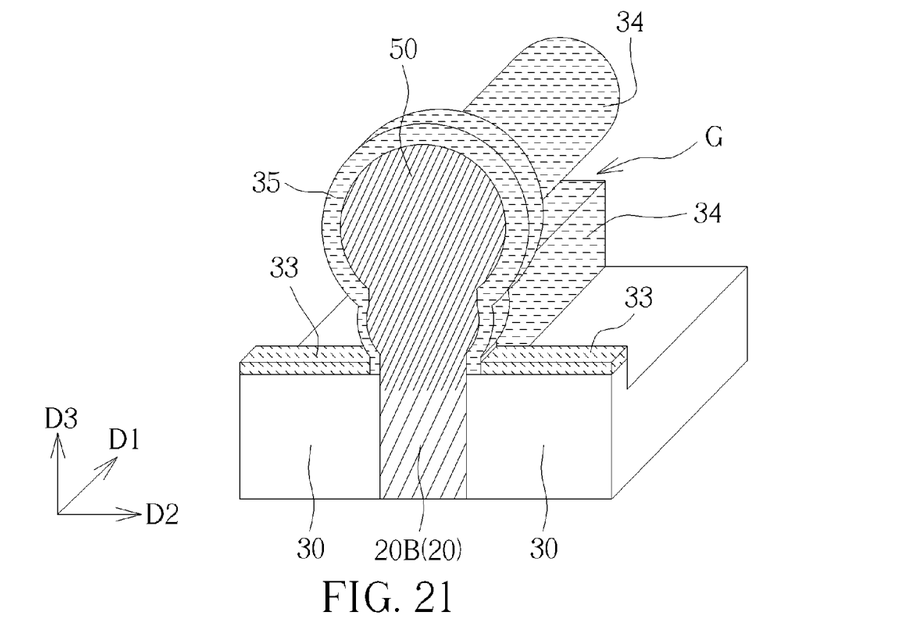
FIG. 21 is a schematic drawing illustrating a corresponding region in FIG. 22.
Figure 22:
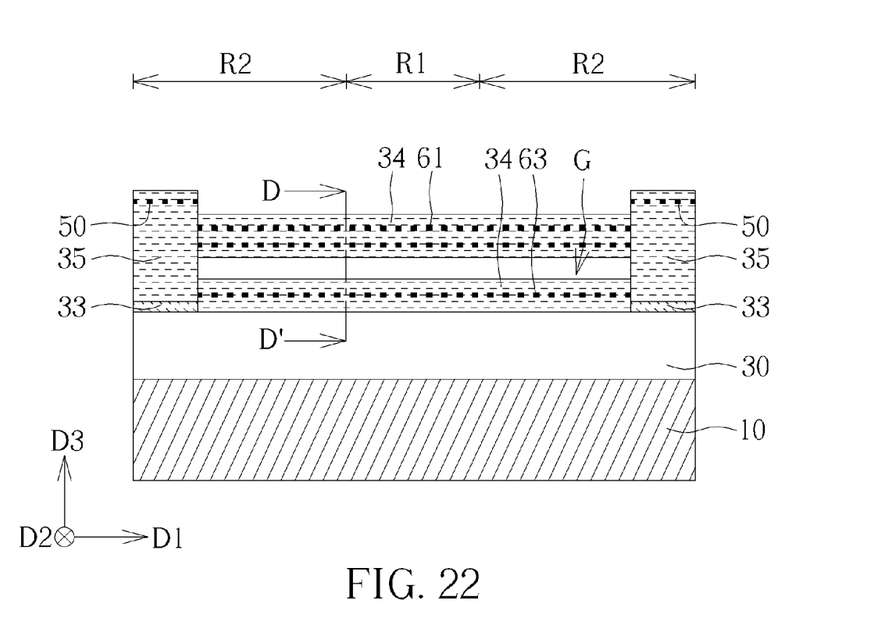
Figure 23:
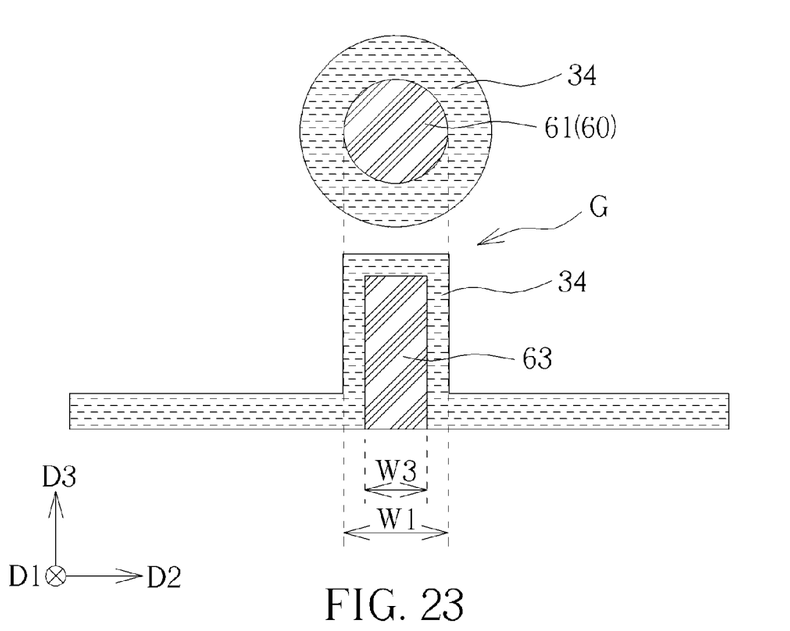
FIG. 23 is a cross-sectional drawing taken along a line D-D' in FIG. 22.
Figure 24:
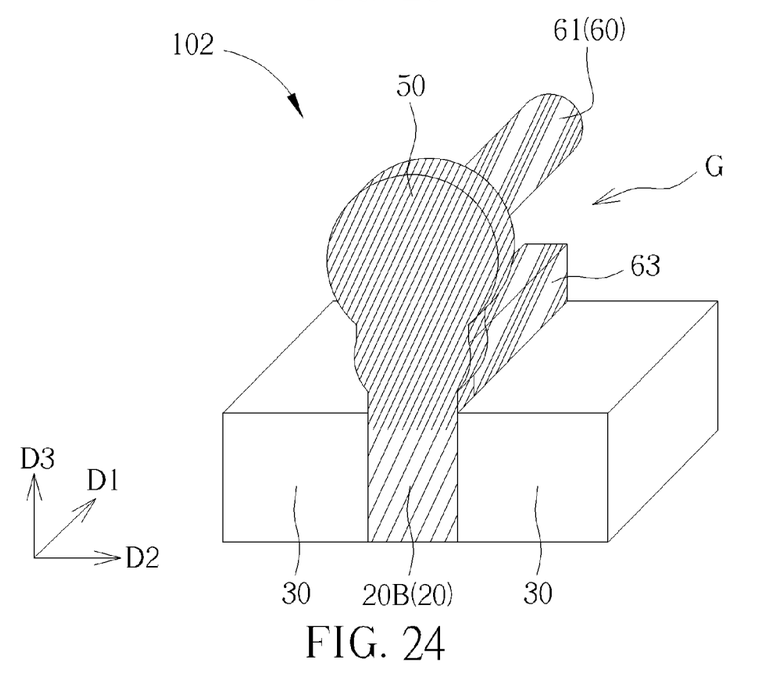
FIG. 24 is a schematic drawing illustrating a corresponding region in FIG. 25.

Please refer to FIGS. 21-25 and FIGS. 10-12 together. FIGS. 21-25 are schematic drawings illustrating a manufacturing method of a nanowire structure according to a second embodiment of the present invention. FIG. 21 is a stereoscopic schematic drawing illustrating a corresponding region in FIG. 22. FIG. 24 is a stereoscopic schematic drawing illustrating a corresponding region in FIG. 25. FIG. 23 is a cross-sectional drawing taken along a line D-D' in FIG. 22. As shown in FIGS. 10-12 and FIGS. 21-23, the difference between this embodiment and the first embodiment mentioned above is that the oxidation process is performed right after the step of forming the epitaxial layer 40 without performing a recessing process (as shown in FIG. 13) to the STI 30. In other words, before the oxidation process, a part of the lower fin 20B is not exposed from the epitaxial layer 40 and the STI 30, and the oxidation process is configured to convert the lower fin 20B covered by the epitaxial layer 40 into a fin structure 63 surrounded by the first oxide layer 34. The fin structure 63 is a germanium fin structure preferably, but not limited thereto. The fin structure 63 is formed between the first nanowire 61 and the substrate 10 in the vertical projective direction D3. In addition, a width of the fin structure 63 will be less than the width of the first nanowire 61 because four sides of the upper fin 20A are covered by the epitaxial layer 40 and only three sides of the lower fin 20B are covered by the epitaxial layer 40 before the oxidation process. For example, the first nanowire 61 has a first width W1 in the second direction D2, the fin structure has a third width W3 in the second direction D2, and the third width W3 is less than the first width W1, but not limited thereto. In other embodiments of the present invention, the fin structure 63 may be formed with a width larger than that of the first nanowire 61 by a cone-shaped fin 20 with a thin top and a wide bottom or by other manufacturing approaches. Additionally, the first nanowire 61 and the fin structure 63 are separated from each other in the first region R1, and the first nanowire 61 and the fin structure 63 are connected to the pillar structures 50 in the second regions R2.

Figure 25:
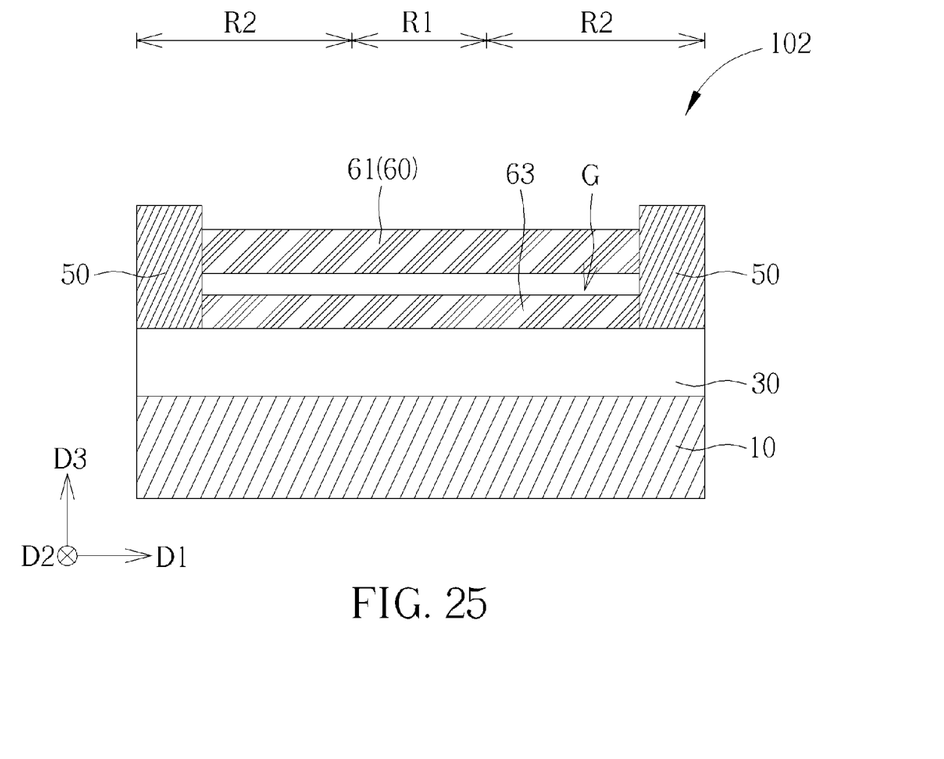
FIG. 25 is a schematic drawing in a step subsequent to FIG. 22.

Subsequently, as shown in FIG. 24 and FIG. 25, the first oxide layer and the second oxide layer formed in the oxidation process mentioned above are removed for forming a nanowire structure 102. As shown in FIG. 24, FIG. 25, and FIG. 23, the nanowire structure 102 in this embodiment includes a nanowire 60 (the same as the first nanowire 61 mentioned above) and the fin structure 63. The nanowire 60 is disposed on the substrate 10. The nanowire 60 extends in the first direction D1. The substrate 10 has a first region R1 and two second regions R2, and the first region R1 is disposed between the two second regions R2 in the first direction D1. The fin structure 63 is disposed between the nanowire 60 and the substrate 10 in the vertical projective direction D3. The fin structure 63 extends in the first direction D1. The nanowire 60 is parallel to the fin structure 63, and the width of the fin structure 63 is different from the width of the nanowire 60. For example, the width of the fin structure 63 may be less than the width of the nanowire 60, but not limited thereto. For instance, the first width W1 of the nanowire 60 in the second direction D2 ranges between 10 nanometers and 30 nanometers preferably, and the third width W3 of the fin structure 63 in the second direction D2 ranges between 7 nanometers and 27 nanometers preferably, but not limited thereto. Additionally, the nanowire structure 102 may further include two pillar structures 50 disposed in the two second regions R2 respectively. The nanowire 60 and the fin structure 63 are separated from each other in the first region R1 by the gap G, and the nanowire 60 and the fin structure 63 are connected to the pillar structures 50 in the second regions R2. In other words, the nanowire 60 and the fin structure 63 aligned in the vertical projective direction D3 are separated from each other in the first region R1 and connected with each other in the second regions R2 via the pillar structures 50. The pillar structures 50 may be used to support the nanowire 60 suspended above the substrate 10. It is worth noting that the manufacturing method in the present invention is not limited to the nanowire 60 and the fin structure 63 mentioned above. In other embodiments of the present invention, a plurality of nanowires and a fin structure aligned in the vertical projective direction D3 may be formed by the same manufacturing approaches.

To summarize the above descriptions, according to the manufacturing method of nanowire structure in the present invention, the nano structure may have a plurality of nanowires or a nanowire and a fin structure aligned in the vertical direction. The purposes of enhancing the integrity and the efficiency of the related units may be achieved accordingly. Additionally, the epitaxial layer is used in the manufacturing method of the present invention to form the nanowire or/and the fin structure containing germanium for enhancing the mobility of the nanowire transistor which may be applied in devices with higher specifications.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a nanowire structure, comprising:
    forming a fin and a shallow trench isolation (STI) on a substrate, wherein the STI surrounds the fin, an upper part of the fin is exposed from the STI, the fin comprises a first region and two second regions, and the first region is disposed between the two second regions;
    forming a first patterned insulation layer on the exposed upper part of the fin;
    recessing the STI for exposing a lower part of the fin;
    forming a second patterned insulation layer on the second regions of the fin, wherein the second patterned insulation layer covers the first patterned insulation layer and the exposed part of the fin in the second region, and the second patterned insulation layer does not cover the first region;
    removing the exposed lower part of the fin for forming an upper fin and a lower fin in the first region; wherein a gap is formed between the upper fin and the lower fin in a vertical projective direction, and the first patterned insulation layer covers a top surface of the first region of the fin in the step of removing the exposed lower part of the fin;
    further recessing the STI is for exposing a portion of the lower fin and a portion of the fin in the second regions;
    removing the first patterned insulation layer on the first region; and
    converting the upper fin into a first nanowire.

2. The manufacturing method of claim 1, further comprising:
    forming a third patterned insulation layer on the second regions, wherein the third patterned insulation layer covers the second patterned insulation layer and the exposed part of the fin in the second regions, and the step of converting the upper fin into the first nanowire comprises:
    forming an epitaxial layer on the upper fin and the lower fin;
    performing an oxidation process, wherein the oxidation process is configured to convert the upper fin covered by the epitaxial layer into a first nanowire surrounded by a first oxide layer and covert the fin covered by the first patterned insulation layer, the second patterned insulation layer, and the third patterned insulation layer in the second regions into two pillar structures covered by a second oxide layer in the two second regions respectively; and
    removing the first oxide layer and the second oxide layer.

3. The manufacturing method of claim 2, wherein the first patterned insulation layer, the second patterned insulation layer, and the third patterned insulation layer comprise silicon nitride or silicon oxynitride respectively.

4. The manufacturing method of claim 2, wherein the epitaxial layer comprises a germanium epitaxial layer or a silicon-germanium epitaxial layer, and the first nanowire comprises a germanium nanowire.

5. The manufacturing method of claim 2, further comprising:
    after the step of forming the epitaxial layer and before the oxidation process, further recessing the STI for exposing at least a part of the lower fin uncovered by the epitaxial layer.

6. The manufacturing method of claim 5, wherein the oxidation process is configured to convert the lower fin covered by the epitaxial layer into a second nanowire surrounded by the first oxide layer.

7. The manufacturing method of claim 6, wherein the second nanowire is formed between the first nanowire and the substrate in the vertical projective direction, and a width of the second nanowire is less than a width of the first nanowire.

8. The manufacturing method of claim 6, wherein the first nanowire and the second nanowire are separated from each other in the first region, and the first nanowire and the second nanowire are connected to the pillar structures in the second regions.

9. The manufacturing method of claim 2, wherein the oxidation process is configured to convert the lower fin covered by the epitaxial layer into a fin structure surrounded by the first oxide layer.

10. The manufacturing method of claim 9, wherein the fin structure is formed between the first nanowire and the substrate in the vertical projective direction, and a width of the fin structure is less than a width of the first nanowire.

11. The manufacturing method of claim 9, wherein the first nanowire and the fin structure are separated from each other in the first region, and the first nanowire and the fin structure are connected to the pillar structures in the second regions.

12. The manufacturing method of claim 1, further comprising:
    forming a gate insulation layer and a gate electrode, wherein the gate electrode surrounds the first nanowire in the first region, and the gate insulation layer is formed between the gate electrode and the first nanowire.

* * * * *